Figure 1:
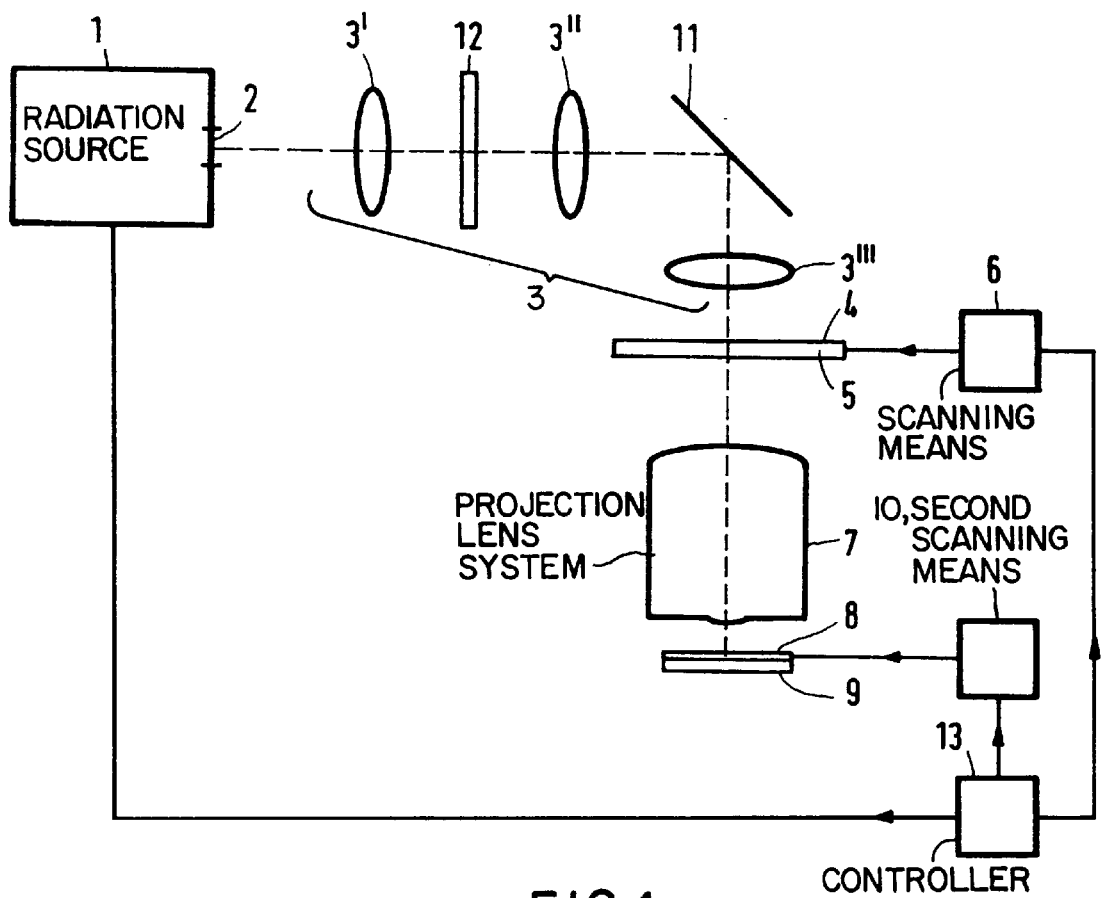

United States Patent [19]
Straaijer et al.

[11] Patent Number: 5,986,742
[45] Date of Patent: Nov. 16, 1999

[54] LITHOGRAPHIC SCANNING EXPOSURE PROJECTION APPARATUS

[75] Inventors: Alexander Straaijer, Eindhoven; Ronald A. M. De Jager, Naarden, both of Netherlands

[73] Assignee: ASML Lithography B.V., Veldhoven, Netherlands

[21] Appl. No.: 08/824,625

[22] Filed: Mar. 27, 1997

[30] Foreign Application Priority Data

Apr. 1, 1996 [EP] European Pat. Off. .............. 96200883

[51] Int. Cl.$^6$ ........................... G03B 27/42; G03B 27/54
[52] U.S. Cl. ............................... 355/53; 355/67
[58] Field of Search ................... 355/53, 55, 57, 355/60, 66, 68, 71; 430/30; 250/492.2, 492.22

[56] References Cited

U.S. PATENT DOCUMENTS

| | | | |
|---|---|---|---|
| 4,924,257 | 5/1990 | Jain | 355/53 |
| 5,663,784 | 9/1997 | Tanimoto | 355/68 |
| 5,699,148 | 12/1997 | Shiozawa | 355/71 |
| 5,721,608 | 2/1998 | Taniguchi | 355/53 |
| 5,728,495 | 3/1998 | Ozawa | 430/30 |
| 5,777,724 | 7/1998 | Suzuki | 355/68 |

OTHER PUBLICATIONS

"Exposure Dose Control Techniques for Excimer Laser Lithography", by David H. Tracy and Fred Y. Wu published in Proceedings of the SPIE, vol. 922, Optical / Laser Microlithography (1998), pp. 437–443.

"Sub–micron 1:1 Optical Lithography" by David A. Markle in the journal Semiconductor International, May, 1996, pp. 137–142.

*Primary Examiner*—Safet Metjahic
*Assistant Examiner*—Hung Henry Nguyen
*Attorney, Agent, or Firm*—Pillsbury Madison & Sutro Intellectual Property Group

[57] ABSTRACT

A lithographic scanning exposure projection apparatus is provided with a radiation source (1) providing radiation pulses, a lens system (3, 7), a mask (5), imaged onto a substrate (9) and scanning apparatus (10) for scanning an image of an exit window (2) of the radiation source at a scanning speed over the substrate (9). A controller (13) controls both the energy of the radiation pulses and the scanning speed in dependence on the required exposure dose on the substrate and the repetition rate of the radiation pulses. The controller ensures maximum throughput of substrates through the apparatus and a minimum dose non-uniformity on the substrates.

6 Claims, 1 Drawing Sheet

LITHOGRAPHIC SCANNING EXPOSURE PROJECTION APPARATUS

The invention relates to a lithographic scanning exposure projection apparatus and, more particularly, to an exposure apparatus for the manufacture of microdevices such as semiconductor devices, liquid crystal devices or magnetic heads, which apparatus irradiates a radiation-sensitive layer by means of a scanned beam of radiation pulses. The invention also relates to a method for irradiating a radiation-sensitive layer by means of a scanned beam of radiation pulses.

In optical scanning lithography systems a pulsed radiation source, such as an excimer laser, exposes a radiation-sensitive layer over a slit-shaped exposure field. By moving the layer relative to the field in a scan direction, the layer will be irradiated by a series of subsequent pulses in overlapping fields. The number of irradiation pulses received by a point of the layer depends on the degree of overlap of the fields. If for instance after twenty pulses the field has moved over a distance equal to its width in the scan direction, a point of the layer will receive twenty irradiations. However, the relative speed between the layer and the field will not be exactly equal to the speed required for a travel of a twentieth of the width between two pulses because of tolerances in the actuators of the table on which the layer is arranged and inaccuracies in the timing of the radiation pulses. Hence, deviations will occur in the exact butting of adjacent instantaneous exposure fields. Points of the layer will receive nineteen, twenty or twenty-one radiation pulses depending on their position and the degree of overlap. This so-called banding-type non-uniformity shows up as band-shaped areas of non-uniform exposure on the radiation-sensitive layer at locations where subsequent exposure fields do not properly butt. In the case of a sharply imaged slit-shaped instantaneous field stop, for instance a stop in the form of an exit window of the radiation source, the non-uniformity takes the form of exposure discontinuities at the locations of the slit edges for each irradiation pulse. The banding-type non-uniformity in the exposure is present even in the absence of pulse-to-pulse fluctuations. The exposure dose control of the layer is therefore intimately related to exposure uniformity control along the scan direction.

The article 'Exposure Dose Control Techniques for Excimer laser Lithography' by D. H. Tracy and F. Y. Wu published in Proceedings of the SPIE, Volume 922 (1988) page 437–443, discloses a lithographic scanning exposure projection apparatus. This projection apparatus reduces the exposure discontinuities by employing a sufficiently high repetition rate of the radiation pulses, such that the number of pulses per irradiated position of the radiation-sensitive layer is of the order of one hundred. This large number of pulses per position is disadvantageous in that the scanning speed of the substrate becomes relatively slow because of the limited repetition rate that can be produced by the radiation source. A low scanning speed results in a low throughput of substrates through the apparatus, increasing the cost per substrate.

It is an object of the invention to reduce the banding-type non-uniformity while maintaining a high throughput of the apparatus.

This object is achieved in a lithographic scanning projection apparatus comprising a radiation source having an exit window for providing radiation pulses of substantially equal energy at a predetermined repetition rate at the exit window to irradiate a substrate having a radiation-sensitive layer with a predetermined exposure dose, an imaging system for imaging the exit window on the radiation-sensitive layer, scanning means for scanning the image of the exit window and the substrate relative to each other at a scanning speed in a scan direction and a controller associated with the radiation source and the scanning means, for controlling the energy of the radiation pulses and the scanning speed in dependence on the exposure dose and the repetition rate.

The maximum throughput of the apparatus is determined by the repetition rate of the radiation source and the maximum energy per radiation pulse. Once a radiation source such as an excimer laser is adjusted for maximum output power, the repetition rate can not be varied at will while maintaining the same output power, because the lasing condition of such a laser is relatively critical for this parameter. Often the repetition rate is crystal controlled. The apparatus according to the invention therefore controls the energy of the pulses and the scanning speed in such a way that the required exposure dose on the radiation-sensitive layer is deposited in as short a time as possible and with a dose non-uniformity which remains below a predetermined maximum value. The energy of each of the radiation pulses is substantially equal during the scanning irradiation of a particular substrate in order to avoid dose non-uniformities. For different substrates the energy may be different, depending on the properties of the radiation-sensitive layer on the substrate.

Preferred embodiments controlling the number of pulses irradiating the radiation-sensitive layer, the energy of the pulses and the scanning speed are given in the dependent claims.

These and other aspects of the invention will be apparent from and elucidated with reference to the embodiments described hereinafter. In the drawings FIG. 1 shows an embodiment of a lithographic scanning projection apparatus according to the invention and FIG. 2 shows the intensity distribution on the substrate.

Figure 2:
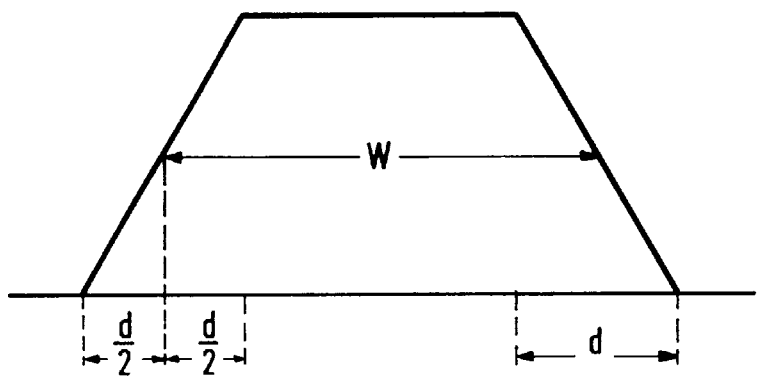

FIG. 1 shows schematically a lithographic scanning projection apparatus according to the invention. The apparatus comprises a radiation source 1, for example an excimer laser, emitting radiation pulses at an exit window 2. The exit window may be the exit plane of an optical integrator, for example a quartz rod as shown, for example, in European application no. 0 658 810. The integrator forms an even intensity distribution over the exit window. The exit window has preferably an elongate shape. An imaging system 3, shown in the Figure as comprising three lenses 3', 3" and 3'", images the exit window 2 on a surface 4 of a mask or reticle 5 having a pattern. First scanning means 6, for example a linear actuator, scans the mask 5 relative to the window image in such a way that the entire pattern provided on the surface 4 is illuminated. Alternatively, the mask 5 may be stationary and the exit window 2 scanned. The long direction of the image of the exit window on the mask is perpendicular to the scan direction, i.e. the direction in which the scanning means 6 displace the mask 5 during the exposure to the pulsed radiation. The elements numbered 1 to 6 form a scanning-slit exposure device.

A projection lens system 7, schematically indicated in the Figure by a single component, images the illuminated part of the mask 4 onto a radiation-sensitive layer 8 arranged on a substrate 9. The substrate may be a semiconductor wafer. The projection lens system 7 has preferably a magnifying power of ¼. The substrate 9 is scanned by second scanning means 10 synchronously with the scanning of the mask 5 taking into account the magnifying power of the projection lens system 7, the motion of the substrate being in the same direction as the motion of the mask or in the opposite direction. The combined scanning of the mask and the substrate is performed in such a way that a series of images displaced in the scan direction is formed on the substrate, the images being of slit-shaped portions of the pattern provided on the surface 4 of the mask 5. A possible scanning sequence is described in the article "Sub-micron 1:1 Optical Lithography" by D. A. Markle in the journal "Semiconductor International" of May 1986, pages 137 to 142. The optical path of the apparatus may be folded by using a mirror 11 in the exposure device.

A controller 13 controls the radiation source 1, the first scanning means 6 and the second scanning means 10. The controller may comprise a micro-processor, a digital signal processor, an analog signal processor, a digital logical circuit or a neural network. The controller has as a first input parameter the required exposure dose D to be irradiated on the radiation-sensitive layer 8. This dose depends on the properties of the material of the layer and the wavelength used for the irradiation. The second input parameter is the repetition rate f of the radiation pulses, the value of which is in general fixed for a radiation source such as an excimer laser. The third input parameter is the maximum energy E(max) per radiation pulse incident on the radiation-sensitive layer 8, which can be delivered by the radiation source in a sustained mode of operation. The value of E(max) is determined by the specific radiation source used and the transmission of the optics between the radiation source and the layer. The controller has as output signals a signal for controlling the energy and a signal for controlling the scanning speed.

For a determination of the energy and the scanning speed the controller requires the number of pulses necessary for irradiation of a point of a specific layer 8 depends on the optimum exposure dose D for the layer, the available energy E(max) and the size of the exposure field on the layer. Therefore, the controller 13 determines the number of radiation pulses $N_1$ with which a point on the radiation-sensitive layer 8 should be irradiated in order to achieve the required exposure dose D according to:

$$N_1 = D \cdot W \cdot H / E(\text{max}),$$

where W is the width of the exposure field, i.e. the image of the exit window 2 on the layer 8 in the scan direction, and H is the height of this field in a direction perpendicular to the scan direction.

The banding-type non-uniformities are minimal when the number of pulses required is an integer. The then remaining non-uniformities are at least in part attributable to the above-mentioned not-exact butting of adjacent instantaneous exposure fields. Most exposure apparatuses take measures to mitigate the effects of the not-exact butting, as will be explained below. The resulting tolerance on the butting gives also rise to a tolerance on the number of pulses required for exposure of a point of the layer 8. Hence, the number of pulses is preferably in a range from N−dN(max) to N+dN(max), where N is an integer and dN(max) is a tolerance on the number of pulses. The value of the tolerance depends, among others, on the shape of the exit window 2, and will be discussed below.

The value of $N_1$, as derived from the required exposure dose, is in general not an integer. According to the invention, the number of pulses actually used during the exposure is derived as follows.

When, in a first case, the difference between the value of $N_1$ and the nearest integer number $N_2$ is less than the tolerance dN(max), the number of pulses $N_3$ will be chosen in the range from $N_2$−dN(max) to $N_2$+dN(max). The difference is understood to be the absolute. The non-uniformities will then still be acceptable. The value of $N_3$ is preferably as close as possible to $N_2$. In this first case, the controller 13 controls the radiation source such that the radiation pulses have an energy E equal to the maximum energy E(max). The scanning speed v of the substrate 9 is set to $$v = W \cdot f / N_3.$$

The scanning speed of the mask is adapted correspondingly.

In a second case the value of $N_1$ deviates more than dN(max) from an integer value. The number of radiation pulses $N_3$ irradiating a point on the layer 8 is then taken to be close to the nearest integer value $N'_2$ greater than $N_1$. To achieve the required dose uniformity, the number $N_3$ lies preferably in a range from $N'_2$−dN(max) to $N'_2$+dN(max). The value of $N_3$ is preferably as close as possible to $N'_2$ to obtain the lowest dose non-uniformity.

In order to deposit the required exposure dose in the second case, the controller 13 controls the radiation source to generate radiation pulses each having an energy E equal to $$E = E(\text{max}) \cdot N_1 / N_3.$$

This attenuation of the energy can be realized by e.g. controlling the excitation voltage of the excimer laser in the radiation source 1 or by controlling an attenuator arranged within the radiation source 1 between the laser and the exit window 2. Possible embodiments of such an attenuator are described in the U.S. Pat. No. 5,119,390, showing six different energy amount controlling means. The scanning speed v of the substrate 9 is controlled to be $$v = W \cdot f / N_3.$$

The number of radiation pulses received by a point on the layer 8 within the time the exposure field passes the point is now equal to an integer.

The remaining banding-type non-uniformities on the layer 8 after having chosen the correct number of pulses will now be due to, amongst others, the not-exact butting of adjacent instantaneous exposure fields. These non-uniformities may be reduced by e.g. the insertion of a scattering element 12 in the optical path or by a defocus of the exit window 2.

The scattering element 12 is arranged in the path of the radiation pulses between the exit window 2 and the mask 5, preferably in a pupil of the imaging system 3. The element reduces the tolerance on the butting of adjacent instantaneous exposure fields on the layer 8. The scattering element 12 causes a blur of the exit window image preferably only in the scan direction. If the scan direction of the mask 5 is taken to be in the plane of the drawing, the scattering element 12 causes a blur also in the plane of the drawing. Instead of by the scattering element, the blur may also be created by a slight defocus of the image of the exit window on the surface 4.

The choice made in the controller 13 between the first and second case depends on the value of the tolerance dN(max). When the shape of the exit window and the imaging properties of the imaging system 3 and projection lens 7 are known, the dose non-uniformity dD as a function of the number of radiation pulses on a point of the layer 8 can be calculated. From this result the relation between the tolerance on the number of pulses and the resulting dose non-uniformity dD can be obtained. The non-uniformity dD must remain below a predetermined maximum value dD(max) as required by the manufacturing process carried out with the apparatus. The corresponding value of the tolerance on the number of pulses is dN(max).

The intensity distribution in the exposure field in the scanning direction may have a substantially trapezoidal shape, for instance realized by defocusing the exit window 2. The relation between the tolerance dN(max) and the required maximum non-uniformity dD(max) is $$dN(max)=dD(max)\cdot d\cdot N^2/(D\cdot W),$$

where d is the width of one flank of the trapezium and W is the width of the exit window image on the layer 8, i.e. the width of the intensity distribution at half height as shown in FIG. 2. The total width of the entire distribution is equal to W+d. The dose non-uniformity dD is defined as the peak-peak variation of the dose. The parameter N is the number of pulses incident on a point of the layer 8 during the passage of a scanned exit window image having a rectangular intensity distribution with a width W. The value of N can be taken as $N_1$ for the calculation of dN(max).

When the edge intensity does not fall off linearly as for the trapezoidal distribution but more smoothly, for example with a cosine or error function, the banding-type non-uniformity is smaller and, consequently, the value of dN(max) for a given dD(max) is larger than for the trapezoidal distribution. The value of dN(max) as a function of dD(max) for a cosine-shaped edge intensity is $$dN(max)=dD(max)1.7\ d^2\cdot N^3/(D\cdot W^2),$$

where d is again the width of one flank of the intensity distribution, the flank having the shape of half a period of a cosine function. The relation for an edge intensity having an error-function shape is $$dN(max)=dD(max)12.5\ N^2/D.$$

As an example, the width of the edge of the image is taken to be 0.2 times the width W of the image, i.e. d/W=0.2, the required maximum relative dose non-uniformity dD(max)/D as 0.001 and the number of pulses N as 15. Then the value of dN(max) for a linear edge intensity is equal to 0.05. For a cosine-shaped edge intensity dN(max) is equal to 0.2 and for an error-function shaped edge intensity dN(max) is equal to 2.8. A value of dN(max) larger than 0.5, which is the maximum possible difference between a number and the nearest integer value, indicates that all values of N in at least a range from N−0.5 to N+0.5 guarantee a relative uniformity better than the mentioned value of 0.001. In such a case the value of N need not be close to an integer anymore to obtain the required dose uniformity.

Table I shows examples of the operation of the controller 13 for a series of required doses D using the following set of parameter values: W=0.8 cm, H=2.6 cm, d=0.2 cm, E(max)=1.5 mJ, dN(max)=0.2 and f=1000 Hz. In the case of a trapezoidal intensity distribution, dN(max)=0.2 corresponds to a maximum non-uniformity of dD(max)/D=0.1%. The above first and second case are indicated by case 1 and case 2 respectively. In the first case the value of $N_3$ has been taken equal to $N_1$, and in the second case the value of $N_3$ has been taken equal to $N_2$.

TABLE I

Dependence of the attenuation and scanning speed on the required exposure dose at a predetermined value of the repetition rate.

| Required dose | number of pulses | | case | attenuation | scanning speed |
|---|---|---|---|---|---|
| (D (mJ/m²) | $N_1$ | $N_3$ | case | E/E (max) (%) | v (cm/s) |
| 20 | 27.73 | 28 | 2 | 99.0 | 28.57 |
| 21 | 29.12 | 29.12 | 1 | 100 | 27.47 |
| 22 | 30.50 | 31 | 2 | 98.4 | 25.81 |
| 23 | 31.89 | 31.89 | 1 | 100 | 25.09 |
| 24 | 33.28 | 34 | 2 | 97.9 | 23.53 |
| 25 | 34.67 | 35 | 2 | 99.1 | 22.86 |

A controller 13 operating according to the invention will deliver the maximum amount of radiation on the radiation-sensitive layer 8 while keeping the dose non-uniformities lower than the maximum allowed value. In this way a maximum throughput rate of substrates through the apparatus is obtained.

We claim:

1. A scanning exposure apparatus comprising:
   a radiation source having an exit window for providing radiation pulses of substantially equal energy at a predetermined repetition rate at the exit window to irradiate a substrate having a radiation-sensitive layer with a predetermined exposure dose;
   an imaging system for imaging the exit window on the radiation-sensitive layer;
   scanning means for scanning the image of the exit window and the substrate relative to each other at a scanning speed in a scan direction; and
   a controller associated with the radiation source and the scanning means for controlling the energy of the radiation pulses and the scanning speed in dependence on the exposure dose and the repetition rate,
   wherein the controller is operatively connected to determine a number of radiation pulses $N_1$ with which a point on the radiation-sensitive layer should be irradiated as equal to $$N_1=(D\cdot W\cdot H)/E(max)$$

where D is the predetermined exposure dose, W is a width of the exit window image in the scan direction, H is a height of the exit window image perpendicular to the scan direction and E(max) is the maximum available energy per radiation pulse, and to determine the number of radiation pulses $N_3$ for irradiating a point on the radiation-sensitive layer:
   (1) in a range from $N_2$−dN(max) to $N_2$+dN(max), with $N_2$ the integer number nearest to $N_1$, if, in a first case, the difference between the value of $N_1$ and $N_2$ is smaller than or equal to dN(max), or
   (2) in a range from $N'_2$−dN(max) to $N'_2$+dN(max), $N'_2$ being the nearest integer number larger than the value of $N_1$, if, in a second case, the difference between $N_1$ and $N_2$ is larger than dN(max),
   where dN(max) is a tolerance value determined by a predetermined maximum dose non-uniformity over the radiation-sensitive layer.

2. Lithographic scanning projection apparatus according to claim 1, wherein in the first case the energy of the radiation pulses is unattenuated and in the second case the energy of the radiation pulses is attenuated by a factor substantially equal to $N_1/N_3$.

3. Lithographic scanning projection apparatus according to claim 1, wherein the scanning speed is substantially equal to:

$$v = W \cdot f / N_3,$$

where f is the repetition rate of the pulses.

4. A method for irradiating a radiation-sensitive layer with a predetermined exposure dose by radiation pulses having a substantially equal energy at a predetermined repetition rate, comprising:

scanning an intensity distribution of the radiation on the layer during exposure at a scanning speed in a scan direction; and controlling the energy of the radiation pulses and the scanning speed in dependence on the exposure dose and the repetition rate, wherein a number of radiation pulses $N_1$ with which a point on the radiation-sensitive layer should be irradiated is determined according to $$N_1 = (D \cdot W \cdot H) / E(\max)$$

where D is the predetermined exposure dose, W is a width of the exit window image in the scan direction, H is a height of the exit window image perpendicular to the scan direction and E(max) is the maximum available energy per radiation pulse, and a tolerance value dN(max) is determined by a predetermined maximum dose non-uniformity over the radiation-sensitive layer, and in which the number of radiation pulses $N_3$ for irradiating a point on the radiation-sensitive layer lies:

(1) in a range from $N_2 - dN(\max)$ to $N_2 + dN(\max)$, with $N_2$ the integer number nearest to $N_1$, if, in a first case, the difference between the value of $N_1$ and $N_2$ is smaller than or equal to dN(max), or (2) in a range from $N'_2 - dN(\max)$ to $N'_2 + dN(\max)$, $N'_2$ being the nearest integer number larger than the value of $N_1$, if, in a second case, the difference between $N_1$ and $N_2$ is larger than dN(max).

5. The method according to claim 4, wherein in the first case the energy of the radiation pulses is unattenuated and in the second case the energy of the radiation pulses is attenuated by a factor substantially equal to $N_1/N_3$.

6. The method according to claim 4, wherein the scanning speed is substantially equal to $$v = W \cdot f / N_3,$$

where f is the repetition rate of the pulses.

* * * * *